United States Patent [19]

Hamamura et al.

[11] Patent Number: 4,844,758
[45] Date of Patent: Jul. 4, 1989

[54] THIN FILM COATING METHOD

[75] Inventors: Fumio Hamamura, Kanagawa; Ichio Fukuda, Tokyo, both of Japan

[73] Assignee: Somar Corporation, Japan

[21] Appl. No.: 159,996

[22] Filed: Feb. 24, 1988

[30] Foreign Application Priority Data

Feb. 24, 1987 [JP] Japan .................................. 62-40909

[51] Int. Cl.$^4$ ............................................. B32B 31/18
[52] U.S. Cl. ..................................... 156/64; 156/361; 156/363; 156/522
[58] Field of Search ............... 156/521, 522, 364, 350, 156/468, 475, 552, 361-363

[56] References Cited

U.S. PATENT DOCUMENTS

| 3,892,618 | 7/1975 | Guiebat | 156/522 X |
| 4,004,962 | 1/1977 | Kleid | 156/522 X |
| 4,377,434 | 3/1983 | Del Bianco | 156/522 X |
| 4,585,509 | 4/1986 | Obayashi | 156/522 X |
| 4,650,536 | 3/1987 | Coraso | 156/521 X |
| 4,717,441 | 1/1988 | Seki et al. | 156/522 X |
| 4,743,325 | 5/1988 | Miyake | 156/522 X |

Primary Examiner—David Simmons
Attorney, Agent, or Firm—Sughrue, Mion, Zinn, Macpeak & Seas

[57] ABSTRACT

In a thin film coating method, tack members are brought close to a surface of a substrate to temporarily tack the forward end portion of a web of thin film to the forward end of the substrate. Compression-bonding rollers are then brought into a tacking position where the forward end portion of the thin film is tacked from a standby position where the compression-bonding rollers do not touch the tack members to make compression-bonding contact with the forward end portion of the tacked thin film after the tack members are moved away from the surface of the substrate. The compression-bonding rollers are then rotated at the tacking position for the double purpose of conveying the substrate and adhering the thin film to the substrate. In this process, the forward end of the substrate is detected to produce a detection signal at a detection position before the substrate is conveyed to the tacking position, the conveyance of the substrate is stopped after the forward end of the substrate has been conveyed from the detection position to the tacking position, and the tack members are brought close to the conveyance passage of the substrate while the forward end of the substrate is being conveyed from the detection position to the tacking position to thereby tack the forward end of the thin film to the surface of the substrate after the forward end of the substrate is stopped at the tacking position.

5 Claims, 9 Drawing Sheets

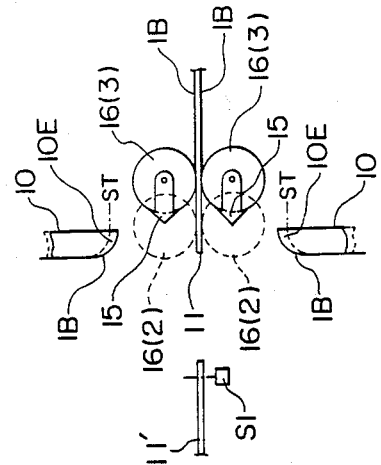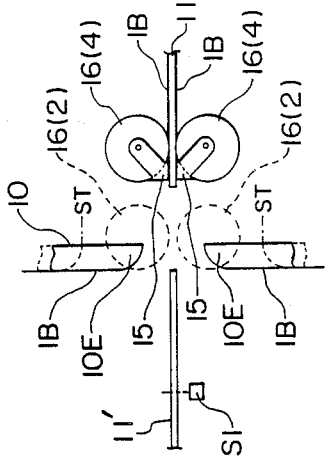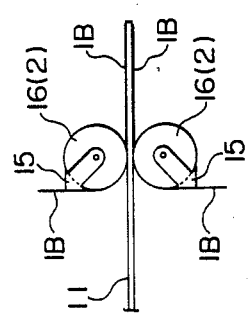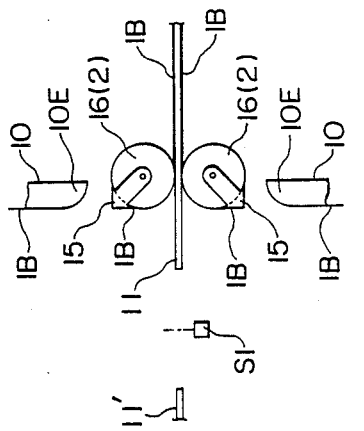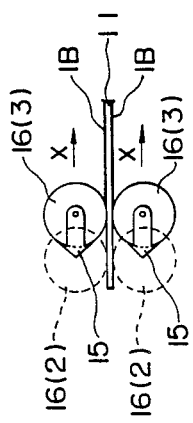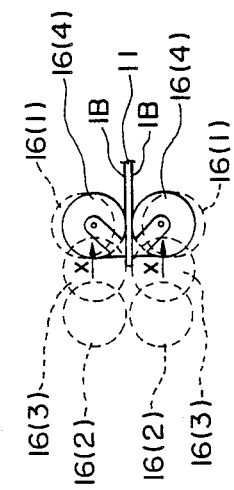

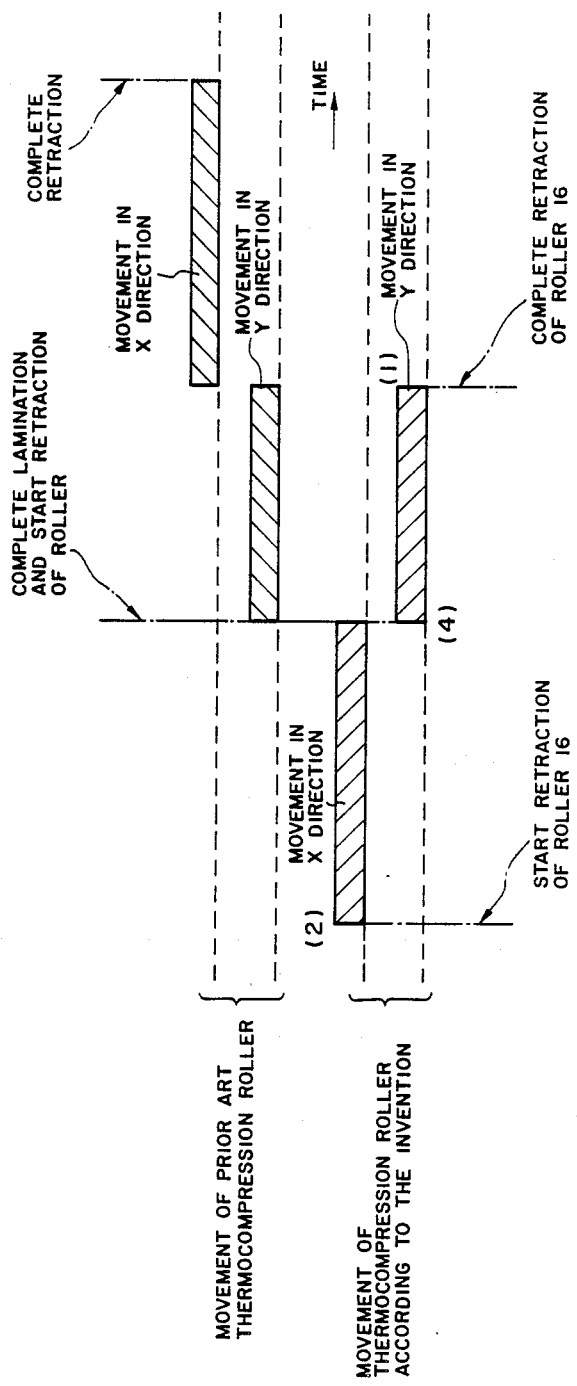

THIN FILM COATING METHOD

BACKGROUND OF THE INVENTION

The present invention relates to a thin film coating technique. More particularly, the invention relates to a thin film coating technique for applying a thin film to the surface of a substrate.

Generally, a printed-circuit board used in electronic devices such as computers and the like is constituted by an insulating substrate and a circuit pattern of copper or the like formed on one of or both sides of the insulating substrate.

Such a printed circuit board can be produced through the following manufacturing process:

a layer of stratified material composed of a light-sensitive resin (photoresist) layer and a light-transmissible resin film (protective film) for protecting the layer is laminated by thermocompression-bonding onto an electrically conductive layer provided on an insulating substrate. Thermocompression-bonding lamination is carried out in mass production by a thin film coating apparatus called a "laminator". Thereafter, a circuit-pattern film is formed on the stratified material, and the light-sensitive resin layer is exposed to light through the circuit-pattern film and light-transmissible resin film for a predetermined time. After the light-transmissible resin film has been peeled off by a separating device, the exposed light-sensitive resin layer is developed to form an etching mask pattern. Then, unnecessary parts of the conductive layer are removed by etching, after which residual parts of the light-sensitive resin layer are removed, thereby completing the printed-circuit board.

The thin film coating apparatus used in the aforementioned printed-circuit board manufacturing process is arranged to automatically laminate the stratified material by thermocompression-bonding. For example, in a thin film coating apparatus as described in commonly assigned Japanese Unexamined Patent Publication No. 60-71229, thermocompression-bonding lamination is carried out as follows:

A web of the stratified material continuously wound on a feed roller of the thin film coating apparatus is fed to the forward end of the surface of a substrate by main vacuum plates. Each of the main vacuum plates has a stratified-material-feeding surface provided with a plurality of suction holes for applying suction to the stratified layer. The main vacuum plate moves to the surface of the substrate while applying suction to the web of stratified material to thereby feed the stratified material. The forward end of the web of stratified material fed to the substrate is tacked temporarily by thermocompression-bonding to the conductive layer of the insulating substrate by an arc-like tack portion provided on the feeding-direction forward end of the main vacuum plate. The forward end of the web of stratified material can be held to the tack portion by a sub-vacuum plate which moves close to and away from the feeding passage of the web of stratified material. The conveyance-direction forward end of the substrate is detected by a sensor (at a detection position) provided along the conveyance passage in front of the tacking position where tacking is carried out. The conveyance-direction forward end of the substrate stops in response to a detection signal produced by the sensor after being conveyed from the detection position to the tacking position. After the conveyance-direction forward end of the substrate has stopped at the tacking position, the tack portion is moved close to the conveyance passage to perform the tacking operation.

After the completion of the tacking, the main vacuum plate moves away from the tacking position.

Next, each of the thermocompression-bonding rollers is moved from the standby position where the roller does not touch the tacking portion (main vacuum plate) so as to come into contact with the web of stratified material at the tacking position where the forward end thereof is tacked. The standby position of the thermocompression-bonding roller is closer to the conveyance passage of the substrate than the tacking position. The thermocompression-bonding roller rotates at the tacking position for the double purpose of laminating the stratified matter onto the surface of the substrate by thermocompression-bonding and conveying the substrate.

After a predetermined length of the stratified material has been laminated by thermocompression-bonding, the stratified material is cut into a predetermined length corresponding to the size of the substrate by the cutting device.

Subsequently, the feeding-direction rearward end of the stratified material cut by the cutting device is thermocompression-bonding-laminated onto the substrate by the thermocompression-bonding roller.

Thereafter, the thermocompression-bonding roller is moved from the tacking position to the standby position, thereby completing thermocompression-bonding lamination.

The aforedescribed conventional thin film coating apparatus is arranged to move the tack portion (main vacuum plate) close to the conveyance passage of the substrate after the conveyance-direction forward end of the substrate has stopped at the tacking position. Therefore, the time required for completing the tacking operation after the stopping of the substrate is long. Accordingly, a problem arises in that thermocompression-bonding-laminating time is long.

Further, in the conventional thin film coating apparatus the thermocompression-bonding roller is moved from the tacking position to the standby position after the rearward end of the stratified material is thermocompression-bonding-laminated to the surface of the substrate. More particularly, the thermocompression-bonding roller moves from the tacking position (i.e., in the Y direction) so as to be separated from the conveyance passage of the substrate. Next, the thermocompression-bonding roller moves to the standby position in the same direction as the conveyance direction of the substrate (i.e., in the X direction). With this arrangement, the time required for moving the thermocompression-bonding roller from the tacking position to the standby position after thermocompression-bonding lamination is long. Accordingly, a problem arises in that the thermocompression-bonding-laminating time of the stratified material is long.

In addition, a problem arises in that in the conventional thin film coating apparatus the productivity is low in manufacturing printed-circuit boards because the thermocompression-bonding-laminating time of the stratified material is long, as described above.

SUMMARY OF THE INVENTION

It is an object of the present invention to provide a technique by which the productivity in thin film coating can be improved.

It is another object of the present invention to provide a technique by which thin film coating time can be shortened.

It is a further object of the present invention to provide a technique by which the time required for moving the tack members can be shortened.

It is still another object of the present invention to provide a technique by which the time required for moving the compression-bonding rollers can be shortened.

These and other objects of the present invention and the features of novelty which characterize the present invention will be apparent from this specification and accompanying drawings.

The present invention will be disclosed in various aspects. In the following, typical aspects of the invention are described in brief.

According to one aspect of the present invention, in a method of coating a substrate with a thin film comprising the steps of bringing tack members close to a surface of the substrate at its forward end in the conveyance direction to thereby temporarily tack a forward end portion of the thin film in the feeding direction onto the forward end surface of the substrate, moving compression-bonding rollers into a tacking position where the forward end portion of the thin film is tacked from a standby position where the compression-bonding rollers do not touch the respective tack members to thereby form the compression-bonding contact with the forward end portion of the tacked thin film after the tack members are moved away from the surface of the substrate, and rotating the compression-bonding rollers at the tacking position for the double purpose of conveying the substrate and adhering the thin film to the substrate, the thin film coating method of the invention is characterized in that the forward end of the substrate is detected to produce a detection signal at a detection position before the substrate is conveyed to the tacking position, the conveyance of the substrate is stopped after the forward end of the substrate has been conveyed from the detection position to the tacking position, and the tack members are brought close to a conveyance passage of the substrate while the forward end of the substrate is being conveyed from the detection position to the tacking position to thereby tack the forward end of the thin film onto the surface of the substrate after the forward end of the substrate has stopped at the tcking position.

According to another aspect of the present invention, the above-mentioned thin film coating method is characterized in that the compression-bonding rollers are moved near to the standby position from the tacking position while the tacked thin film is being adhered to the surface of the substrate.

According to a further aspect of the present invention, the above-mentioned thin film coating method is characterized in that the forward end of the substrate is detected to produce a detection signal at a detection position before the substrate is conveyed to the tacking position, the conveyance of the substrate is stopped after the forward end of the substrate has been conveyed from the detection position to the tacking position, the tack members are brought close to a conveyance passage of the substrate while the forward end of the substrate is being conveyed from the detection position to the tacking position to thereby tack the forward end of the thin film onto the surface of the substrate after the forward end of the substrate has stopped at the tacking position, and the compression-bonding rollers are moved near to the standby position from the tacking position while the tacked thin film is being adhered to the surface of the substrate.

According to the present invention, in the arrangement described above, the time required for moving the tack members close to the conveyance passage can be partly included in the time required for conveying the conveyance-direction forward end of the substrate from the detection position to the tacking position, and hence the time required for moving the tack members close to the conveyance passage after the stoppage of the substrate can be shortened, whereby the time required for adhering the thin film can be shortened.

Further, according to the present invention, in the arrangement described above, the time required for moving the compression-bonding rollers from the tacking position to the standby position can be partly included in the time required for adhering the thin film onto the surface of the substrate, and thus the time required for movement of the compression-bonding rollers after the thin film is adhered to the surface of the substate can be shortened, whereby the total time required for applying the thin film can be shortened.

Furthermore, according to the present invention, in the arrangement described above, not only can the time required for moving the tack members close to the conveyance passage be shortened, but also the time taken for movement of the compression-bonding rollers after the thin film is adhered to the surface of the substrate can be shortened, resulting in the total time required for applying the thin film can be shortened remarkably.

Consequently, the unit time for thin film coating is reduced, and hence the manufacturing efficiency of thin film coating process improved.

BRIEF DESCRIPTION OF THE DRAWINGS

FIGS. 8 through 16 are partly enlarged views of portions of FIG. 1 illustrating respective work steps showing a method of thermocompression-bonding lamination;

FIGS. 17 through 20 are partly enlarged views of portions of FIG. 1 illustrating respective work steps in another method of thermocompression-bonding lamination according to the invention; and FIG. 21 is a timing chart for explaining the operation of the thermocompression-bonding rollers.

DESCRIPTION OF THE PREFERRED EMBODIMENTS

A preferred embodiment of the invention, in the case where the invention is applied to a thin-film coating apparatus for thermocompression-bonding and laminating a layer of a stratified material composed of light-sensitive resin layers and light-transmissible resin films onto a substrate for a printed circuit, will be described in detail hereunder with reference to the drawings, in which like parts are correspondingly referenced for the purpose of simplification of description.

Figure 1:
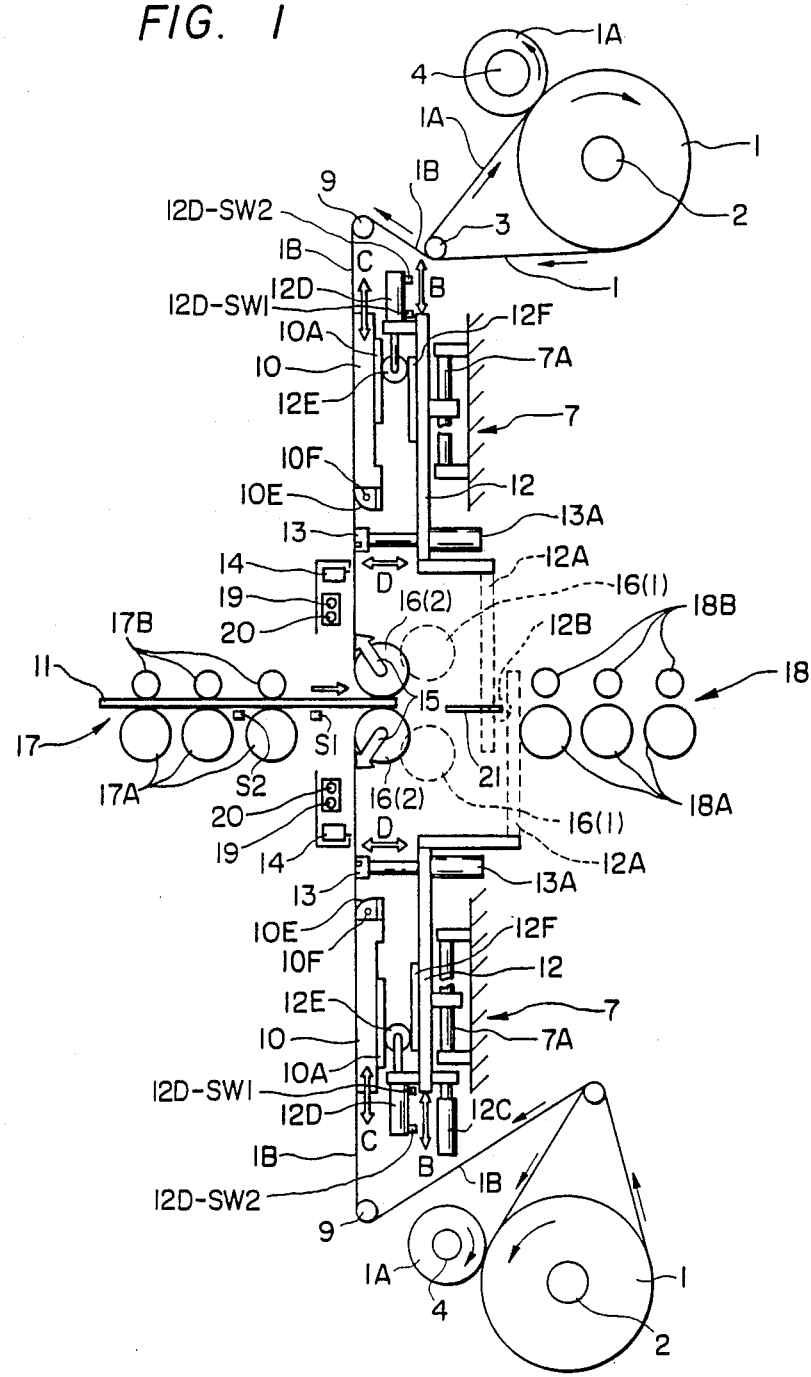
FIG. 1 is a schematic view of a thin film coating apparatus operating in accordance with a preferred embodiment of a method of the present invention.

A thin-film coating apparatus constructed and operating according to the present invention is shown in the schematic view of FIG. 1.

As shown in FIG. 1, a web of a three-layer stratified material 1 constituted by a light-transmissible resin film layer, a light-sensitive resin layer and a light-transmissible resin film layer, is continuously wound on a feed roller 2. The stratified material 1 on the feed roller 2 is separated into a light-transmissible resin film (protective film) part 1A and a stratified part 1B by a thin-film separating roller 3. More particularly, the stratified part 1B is constituted by a light-sensitive resin layer exposed on one surface (adhesive surface), and a light-transmissible resin film layer. The separated light-transmissible resin film part 1A is taken up by a take-up roller 4.

Figure 2:
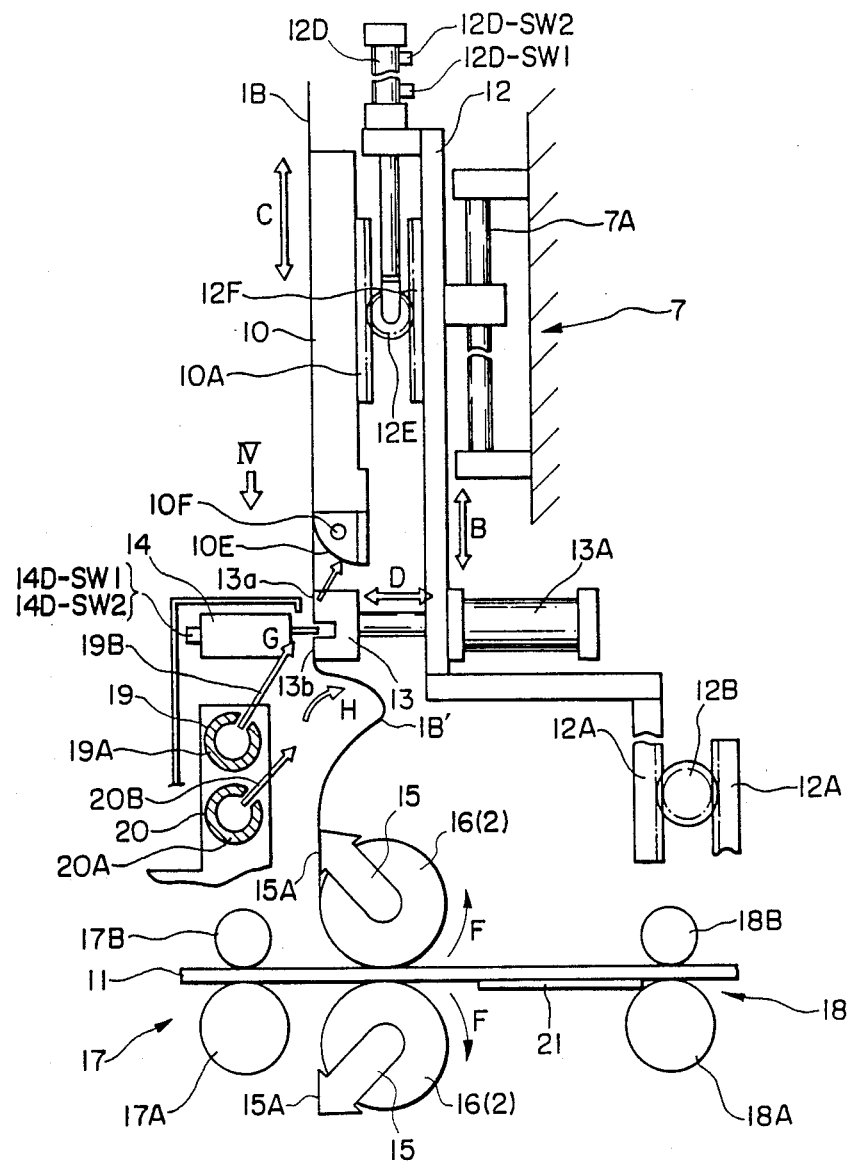
FIG. 2 is a partly enlarged view of a portion of FIG. 1.

A forward end of the stratified part 1B separated by the thin-film separating roller 3 is held by a main vacuum plate 10 through a tension roller 9 as shown in FIGS. 1 and 2 (partly enlarged view).

The tension roller 9 applies a moderate amount of tension to the stratified part 1B between the feed roller 2 and the main vacuum plate 10. More particularly, the tension roller 9 is arranged to prevent the fed stratified part 1B from crumpling.

The main vacuum plate (thin-film feed member) 10 is arranged to feed the stratified part 1B onto an electrically conductive layer (for example, Cu layer) on an electrically insulating substrate 11 from the feed roller 2. As shown in FIGS. 1 and 2, the main vacuum plate 10 is provided on a supporting member 12 which can move close to and away from the insulating substrate 11 (in the directions of the arrow B). The supporting member 12 is provided on an apparatus body (box-like body of the thin-film coating apparatus) 7 so as to be slidable on a guide member 7A in the directions of the arrow B. Although a description has been made about a single supporting member 12 for the purpose of simplicity, it is to be understood that in fact a pair of upper and lower supporting members 12 are provided above and below the conveyance passage of the insulating substrate 11. The upper and lower supporting members 12 are operated by a rack-and-pinion mechanism interlocked with each other so that both the pair of supporting members 12 simultaneously move to approach or move away from each other. More particularly, the pair of upper and lower supporting members 12 are operated in an interlocked manner by racks 12A respectively provided thereon and pinions 12B engaged with the respective racks 12A. The operation of the supporting members 12 is carried out by a driving source 12C provided on the lower supporting member 12. For example, the driving source 12C can be an air cylinder. Otherwise, the driving source 12C may be constituted by a hydraulic cylinder, an electromagnetic cylinder, or a stepping motor, together with a transmission device for transmitting the displacement of the driving source to the supporting members 12.

The main vacuum plate 10 is mounted on the supporting member 12 in such a manner that the main vacuum plate 10 can move close to and away from the insulating substrate 11 (in the directions of the arrow C) independently of the motion of the supporting member 12. The main vacuum plate 10 is operated by a driving source 12D and a rack-and-pinion mechanism provided on the supporting member 12. The rack-and-pinion mechanism is constituted by a pinion 12E provided on the driving source 12D, a rack 12F provided on the supporting member 12, and a rack 10A provided on the main vacuum plate 10. The driving source 12D may be constituted by the same components as those of the driving source 12C.

Figure 3:
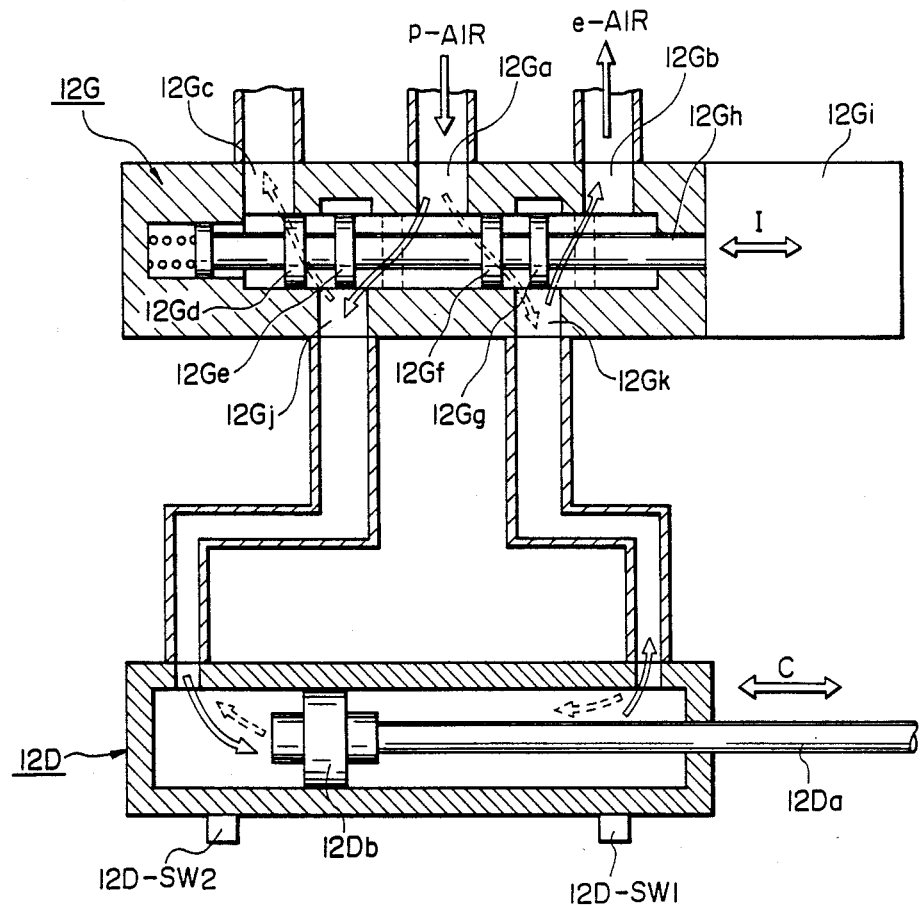
FIG. 3 is a schematic sectional view showing the arrangement of driving sources depicted in FIGS. 1 and 2 and showing an electromagnetic valve for controlling those driving sources.

The driving source 12D constituted by an air cylinder is controlled by an electromagnetic valve 12G as shown in FIG. 3 (schematic sectional view). The electromagnetic valve 12G is composed of a suction port 12Ga, two exhaust ports 12Gb and 12Gc, control valves 12Gd to 12Gg, a control rod 12Gh, an electromagnetic solenoid 12Gi, and two suction-and-exhaust ports 12Gj and 12Gk.

A compressed air source (compressor) supplies pressured air p-air to the suction port 12Ga. The air p-air is fed to the driving source 12D to thereby move a shaft 12Da of the driving source 12D in the directions of the arrow C. After the shaft 12Da has been moved by the air p-air fed to the driving source 12D, the air p-air is pressed from the driving source 12D to the exhaust ports 12Gb and 12Gc by the motion of the shaft 12Da.

The control valves 12Ge, 12Gf and control valves 12Gd, 12Gg selectively use either of the suction-and-exhaust ports 12Gj and 12Gk as a suction port or as an exhaust port. The control valves 12Ge to 12Gg make such selection when the control rod 12Gh of the electromagnetic solenoid 12Gi is moved in the direction of the arrow I. The electromagnetic solenoid 12Gi is controlled by a CPU 24, which will be described later.

Although the aforementioned embodiment relates to the case where an air cylinder is used as the driving source 12D for controlling the electromagnetic valve 12G, it is a matter of course that the invention is not limited thereto and that a hydraulic cylinder may be used as the driving source.

As shown in FIGS. 1 to 3, the driving source 12D is provided with switches 12D-SW1 and 12D-SW2 which operate (turn on and off) corresponding to the position of the shaft 12Da. The switch 12D-SW1 operates when the shaft 12Da of the driving source 12D is in the outwardmost (fully extended) position, or in other words, when the main vacuum plate 10 moves close to the conveyance passage of the insulating substrate 11. The switch 12D-SW2 operates when the shaft 12Da of the driving source 12D is in the inwardmost (fully retracted) position, or in other words, when the main vacuum plate 10 moves away from the conveyance passage of the insulating substrate 11. Each of the switches 12D-SW1 and 12D-SW2 is constituted by a magnetic proximity switch. The magnetic proximity switches are operated by a magnetic force when a movable member 12Db provided at an end of the shaft 12Da (within the cylinder) within the driving source 12D moves close to the switch. Otherwise, each of the switches 12D-SW1 and 12D-SW2 may be constituted by a microswitch operated by mechanical contact through the movement of the movable member 12Db.

The main vacuum plate 10 is provided with a plurality of suction holes (not shown) arranged to hold the stratified part 1B by a suction force. The suction holes are connected through an exhaust pipe to a vacuum source, such as a vacuum pump or the like. The suction operation of the main vacuum plate 10 is controlled independently of the suction operation of a tack portion 10E, which will be described later.

The tack portion 10E, having an arc-like surface to hold by suction stratified part 1B, is provided at the forward end of the main vacuum plate 10 in the feeding direction of the stratified part 1B. The tack portion 10E is formed integrally with the main vacuum plate 10. As shown in FIGS. 1 and 2, a heater 10F is provided within the tack portion 10E to thereby heat the arc-like portion. The tack portion 10E is arranged to tack the forward end of the stratified part 1B to the conductive layer of the insulating substrate 11 temporarily by thermocompression-bonding when the stratified part 1B is fed onto the main vacuum plate 10.

Although the aforementioned embodiment has been described with respect to the case where the tack portion 10E is formed integrally with the main vacuum plate 10, the invention is applicable also to the case where the tack portion 10E is formed independently of the main vacuum plate 10 and where those components are provided on the supporting member 12.

A sub-vacuum plate (thin-film supporting member) 13 is provided in a position near the tack portion 10E, more particularly, in the vicinity of the feed passage of the stratified part 1B between the tack portion 10E and the insulating substrate 11. As shown in FIG. 2, the sub-vacuum plate 13 has an upper suction portion 13a and a lower suction portion 13b provided with suction holes (not shown). The sub-vacuum plate 13 is formed like U, the U-shaped portion corresponding to a cut position of the stratified part 1B. The upper suction portion 13a mainly holds the forward end of the stratified part 1B in the feeding direction to thereby hold it to the tack portion 10E. The sub-vacuum plate 13 is mounted on the supporting member 12 through a driving source 13A, such as an air cylinder, which moves toward and away from the feeding passage of the stratified part 1B, in the direction of the arrow D to thereby make it possible to hold the forward end of the stratified part 1B to the tack portion 10E.

On the other hand, the lower suction portion 13b of the sub-vacuum plate 13 is arranged to hold by suction a rear end portion of the stratified part 1B after being cut by a cutting device 14 and keep the stratified part 1B within the feeding passage. After thermocompression-bonding laminating starts, the lower suction portion 13b slackens the stratified part 1B between a rotary vacuum plate 15 and itself, as shown in FIG. 2, so that a slackened stratified part 1B' is prepared. The slackened stratified part 1B' can be formed by making the feeding speed of the stratified part 1B of the main vacuum plate 10 greater than the feeding speed (thermocompression-bonding laminating speed) of a thermocompression-bonding roller 16. Both speeds are controlled by a sequence control circuit (not shown).

The driving source 13A of the sub-vacuum plate 13 may be constituted by an air cylinder, or may be implemented with a hydraulic cylinder or the like, in the same manner as the driving source 12C.

The cutting device 14 is mounted on the apparatus body 7 in the vicinity of the feeding passage of the stratified part 1B between the tack portion 10E and the insulating substrate 11, specifically, between the tack portion 10E and the rotary vacuum plate 15. More particularly, the cutting device 14 is provided at a position opposite the sub-vacuum plate 13 when the stratified part 1B is carried to the cutting position by the sub-vacuum plate 13. The cutting device 14 is placed on the side of a front-stage conveyer 17 for conveying the insulating substrate 11. Otherwise, it may be placed directly on the front-stage conveyer 17. The cutting device 14 cuts the stratified part 1B continuously fed by the main vacuum plate 10 into predetermined lengths corresponding to the size of the insulating substrate 11.

Figure 4:
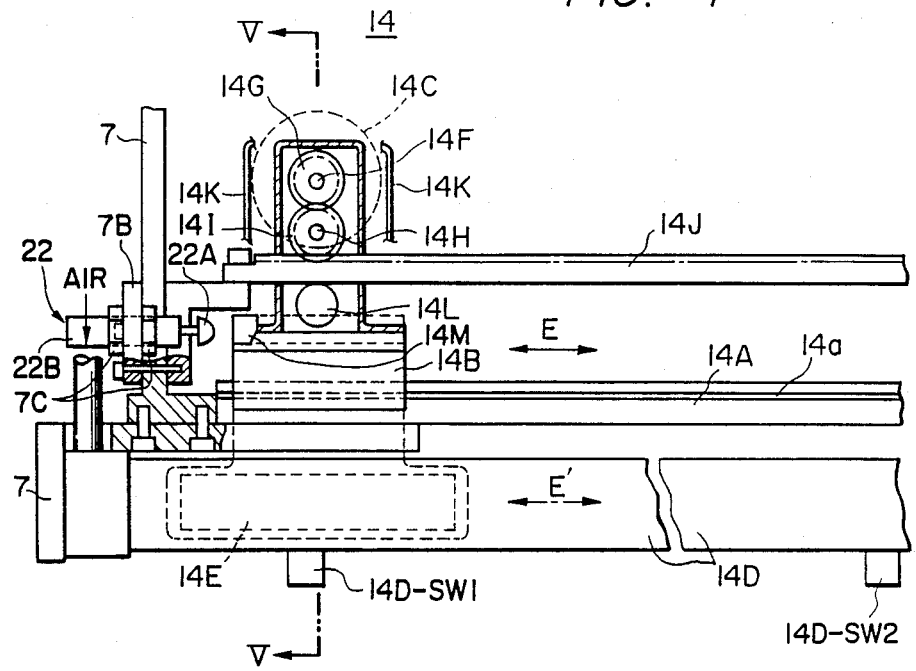
FIG. 4 is a schematic plan view of a cutting device as seen from the direction of an arrow IV in FIG. 2.
Figure 5:
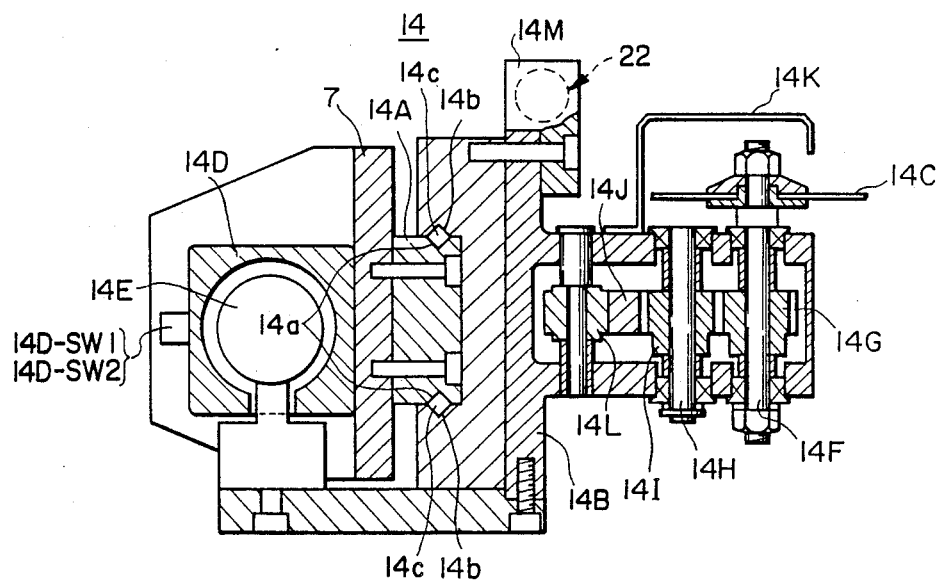
FIG. 5 is a partly sectional view of the cutting device, taken along a line V—V in FIG. 4.
Figure 6:
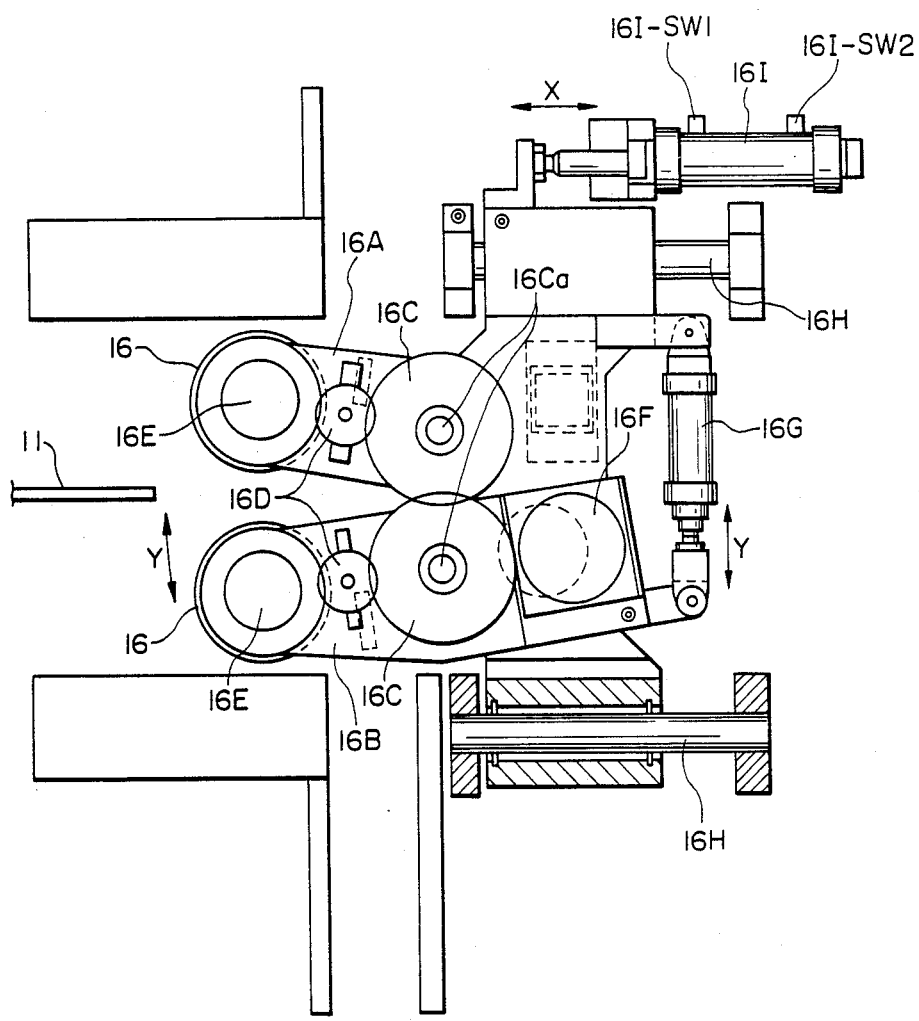
FIG. 6 is a schematic view of an arrangement for driving and moving thermocompression-bonding rollers depicted in FIGS. 1 and 2.

The detailed construction of the cutting device 14 is shown in FIG. 4, which is a schematic plan view seen in the direction of an arrow IV in FIG. 2, and in FIG. 5, which is a sectional view taken along a line V—V in FIG. 4.

As shown in FIGS. 4 and 5, the cutting device 14 is constituted by a guide member 14A, a movable member 14B, and a disc-like cutter 14C.

The guide member 14A extends in the direction of width of the stratified part 1B and has its opposite ends (or one end) fixed to the apparatus body 7, by screws, bolts, nuts, an adhesive agent or the like. The guide member 14A is provided with the movable member 14B which can move stably and smoothly in the direction of the feeding width of the stratified part 1B (in the direction of an arrow E of FIG. 4). More particularly, the movement of the movable member 14B is effected through a cylindrical roll 14c provided between a concave portion 14a of the guide member 14A and a concave portion of the movable member 14B.

The movable member 14B is arranged to move in the direction of the arrow E along the guide member 14A. The movable member 14B extends along the guide member 14A and is connected to a movable member (motor) 14E mounted in a hollow tube 14D and which moves in the direction of the arrow E' within the hollow tube 14D with its opposite ends supported by the apparatus body 7. The movable member 14E is shaped like a cylinder of a diameter less than the internal diameter of the hollow tube 14D. A sealing member, for example, an O-ring, keeps the movable member 14E close to the internal wall of the hollow tube 14D. The hollow tube 14D is continuously automatically sealed except for a junction between the movable member 14E and the movable member 14B, so that the hollow tube 14D is maintained airtight. The movable member 14E is moved by the supply and withdrawal of a fluid such as air or the like from the end portions of the hollow tube 14D. More particularly, when a fluid is supplied into the hollow tube 14D from left to right in FIG. 4, the movable member 14E moves from left to right. When a fluid is supplied into the hollow tube 14D from right to left in FIG. 4, movable member 14E moves from right to left. In short, the movable member 14E is arranged to move the movable member 14B through a fluid. Although this embodiment has been described with reference to the case where air is used as the fluid supplied into the hollow tube 14D, it is a matter of course that a gas such as an inert gas or the like, or a liquid such as water, oil or the like, may be used. Further, the movable member 14B may be operated by an air cylinder (rod type), a hydraulic cylinder, motor or the like.

The disc-like cutter 14C, which rotates as the movable member 14B moves, has a blade provided at least on its circumference used to cut the stratified part 1B. Rotation of the disc-like cutter 14C is effected by the engagement between a rack 14J and a gear 14I provided on a rotary shaft 14H, through a gear (pinion) 14G provided on a rotary shaft 14F. The rack 14J has its opposite ends (or one end) fixed to the apparatus body 7, as shown in FIG. 4, by screws, bolts, nuts or the like. The engagement between the rack 14J and the gear 14I is stabilized by a keeper roller 14L provided on the movable member 14B.

The disc-like cutter 14C is formed of metal material such as a high-speed tool steel or the like. Fluorine resin is applied to at least the surface of the blade. Fluorine resin is inert to most chemicals, superior in its thermal insulating effect, has a small coefficient of friction, and is resistant to the build-up of most substances. Particularly, in the thin-film coating apparatus, fine chips containing various chemicals and produced by cutting the stratified part 1B are often deposited on the blade. Accordingly, fluorine resin coating is effective to prevent a deterioration in the cutting performance of the blade.

A protection cover 14K for the disc-like cutter 14C is provided on the movable member 14B in the vicinity of the disc-like cutter 14C in order to ensure worker safety.

In the cutting device 14, the stratified part 1B can be cut into lengths corresponding to the length of the insulating substrate 11 by the rotation of the disc-like cutter 14C produced when the movable member 14B moves the guide member 14A unidirectionally. Because the disc-like cutter 14C can make a reciprocating motion, the cutting time of the stratified part 1B can be shortened.

According to this thin-film coating apparatus, the cutting device 14 is fixed to the apparatus body 7. Thus, members supported by the supporting member 12 can be reduced in weight so that the supporting member 12 can be driven by a driving source 12C of a small driving capacity.

As shown in FIGS. 4 and 5, shock absorbers 22 is provided on the apparatus body 7 in the vicinity of the stopped position of the disc-like cutter 14C of the cutting device 14, or, in other words, in the vicinity of each widthwise end portion of the stratified part 1B. The shock absorber 22 is mainly composed of a shock absorber movable portion 22A and a shock absorber stationary portion 22B. The shock absorber stationary portion 22B is mounted on the apparatus body 7 through a supporting frame 7B and a nut 7C mounted by a fixing member, such as a screw or the like. The shock absorber movable portion 22A contacts a contact member fixed to the movable member 14B of the cutting device 14 by a fixing member, such as a screw, bolt or the like. The contact member 14M as the whole may be formed of a metal material. Otherwise, all or part of the contact member 14M may be formed of a shock-absorbing elastic material, such as plastics, rubber or the like, for the double purpose of absorbing shocks and protecting its contact portion. The shock absorber 22 absorbs shocks produced when the disc-like cutter 14C of the cutting device 14 stops its motion. As a result, vibration of the cutting device or apparatus body 7 is reduced.

For example, the shock absorber 22 may be constituted by a fluid damper of the fluid viscous type, of the fluid dynamic type, or may be constituted by an electromagnetic damper. The fluid used in each of the fluid viscous damper and the fluid dynamic damper can be selected from gases, such as air, an inert gas or the like, and liquids, such as water, oil (for example, silicone oil) and the like.

Although this embodiment has been described with respect to the case where the shock absorber 22 is provided on the apparatus body 7, it is to be understood that the invention is not limited thereto and that the shock absorber may be provided on the cutting device 14, for example, on the movable member 14B, on fixed rack 14J, on the guide member 14A or on the outside of the hollow tube 14D.

A switch 14D-SW1 is provided on the left end portion of the hollow tube 14D of the cutting device 14, and a switch 14D-SW2 is provided on the right end portion thereof. Each of the switches 14D-SW1 and 14D-SW2 is constituted by a magnetic proximity switch in the same manner as described above with respect to the switches 12D-SW1 and 12D-SW2. More particularly, when a fluid is supplied into the hollow tube 14D from the right to thereby move the movable member 14E close to the left end portion of the hollow tube 14D from right, the switch 14D-SW1 is operated by magnetic force. On the other hand, when a fluid is supplied into the hollow tube 14D from the left to thereby move the movable member 14E close to the right end portion of the hollow tube 14D from the left, the switch 14D-SW2 is operated by magnetic force.

After the forward end of the stratified part 1B is tacked temporarily by thermocompression-bonding onto the conductive layer of the insulating substrate 11 by the tack portion 10E of the main vacuum plate 10 as shown in FIGS. 1 and 2, the whole of the stratified part 1B is thermocompression-bonding-laminated by a thermocompression-bonding roller 16. The thermocompression-bonding roller 16 is placed in its standby position, as shown by a dotted line 16(1) in FIG. 1, while the forward end of the stratified part 1B is tacked by the tack portion 10E. During the tacking operation, the thermocompression-bonding roller 16 in its standby position does not touch the tack portion 10E moving close to the tacking position. After the tacking operation, the thermocompression-bonding roller 16 moves from the standby position shown by the dot line 16(1) to the tacking position 16(2) shown by a solid line. The thermocompression-bonding roller 16 placed in the tacking position holds the insulating substrate 11 through the stratified part 1B.

The thermocompression-bonding roller 16 is moved between the standby position 16(1) and the tacking position 16(2) by a moving device. The moving device is mainly constituted by an upper stationary frame 16A, a lower movable frame 16B, gears 16C to 16E, a driving motor 16F, a Y-direction driving source 16C, and X-direction guide member 16H, and an X-direction driving source 16I.

The upper thermocompression-bonding roller 16 as shown in FIGS. 1 and 2 is rotatably supported on the upper stationary frame 16A. The lower thermocompression-bonding roller 16 is rotatably supported on the lower stationary frame 16B.

Follower gears 16E are fixed on the rotary shafts of the upper and lower thermocompression-bonding rollers 16. The rotation of the driving gears 16C is transmitted to the gears 16E through intermediate gears 16D. The gear 16C of the upper stationary frame 16A and the gear 16C of the lower movable frame 16B are engaged at all times because the distance between the rotary shafts 16C$a$ of the gears 16C is kept constant.

The rotary shaft of the motor 16F provided on the lower movable frame 16B is connected to the gear 16C of the lower movable frame 16B. In short, the upper and lower thermocompression-bonding rollers 16 are driven by the motor 16F through the gears 16C to 16E.

The lower movable frame 16B rotates in the direction of the arrow Y around the rotary shaft 16Ca of the gear 16C so that the lower movable frame 16B can move toward and away from the conveyance passage of the insulating substrate 11. That is, the upper thermocompression-bonding roller 16 is stationary while the lower thermocompression-bonding roller 16 moves in the direction of the arrow Y. Accordingly, the insulating substrate 11 can be supported between the upper and lower thermocompression-bonding rollers 16.

The motion of the lower movable frame 16B in the direction of the arrow Y is effected by the Y-direction driving sourve 16G provided on the upper stationary frame 16A. The Y-direction driving source 16G may be constituted by an air cylinder in the same manner as the driving source 12D as described above. The movable shaft, which is movable in the direction of the arrow Y, is connected to the lower movable frame 16B.

The upper stationary frame 16A is slidable in the direction of the arrow X parallel to the conveyance passage of the substrate through the X-direction guide member 16H fixed to the apparatus body 7. The sliding operation of the upper stationary frame 16A in the direction of the arrow X is effected by the X-direction driving source 16I. For example, the X-direction driving source 16I is constituted by an air cylinder in the same manner as described above with respect to the Y-direction driving source 16G and the driving source 12D.

The X-direction driving source 16I is provided with switches 16I-SW1 and 16I-SW2. Each of the switches 16I-SW1 and 16I-SW2 is constituted by a magnetic proximity switch in the same manner as the switches 12D-SW1, 12D-SW2, 14D-SW1 and 14D-SW2. When the shaft of the X-direction driving source 16I is extended to its full length, or, in other words, when the thermocompression-bonding roller 16 is moved to the tacking position 16(2) or its vicinity, the switch 16I-SW1 is operated. When the shaft of the X-direction driving source 16I is retracted to its shortest length, or, in other words, when the thermocompression-bonding roller 16 is moved to the standby position 16(1) or its vicinity 16(4) (as will be described below), the switch 16I-SW2 is operated.

After the forward end of the stratified part 1B is tacked, the thermocompression-bonding rollers 16 rotate in the direction of the arrows F shown in FIG. 2 while the insulating substrate 11 is supported between the thermocompression-bonding rollers 16 through the stratified part 1B. Thus, the stratified part 1B is thermocompression-bonding-laminated onto the conductive layer of the insulating substrate 11, and the insulating substrate 11 is conveyed. During the thermocompression-bonding-laminating process, the main vacuum plate 10 and the sub-vacuum plate 13 release the stratified part 1B. That is, the stratified part 1B is automatically fed to the thermocompression-bonding rollers 16 from the feed roller 2 by the rotational force thereof and the force supporting the insulating substrate 11.

The rear end portion of the stratified part 1B cut by the cutting device 14 is thermocompression-bonding-laminated by the thermocompression-bonding rollers 16 while being guided by triangular rotary vacuum plates 15 to thereby prevent the stratified part 1B from crumpling. The rotary vacuum plates 15 are supported by the same shafts of the thermocompression-bonding rollers 16 so as to be rotated around the shafts. A plurality of suction holes 15A (not shown) are provided in the suction surface of the respective rotary vacuum plate 15 disposed opposite the stratified part 1B. The structure of the suction surface provided with the suction holes 15A is similar to that of the suction surface in the main vacuum plate 10. Further, such suction holes may be provided in the upper surface of the rotary vacuum plate 15 for the purpose of slackening the stratified part 1B', as shown in FIG. 2.

As shown in FIGS. 1 and 2, the insulating substrate 11 is conveyed to the tacking position of the stratified part 1B in the thin-film coating apparatus by the front-stage conveyer 17 constituted by lower conveyer rollers 17A and upper conveyer rollers 17B. The front-stage conveyer 17 is provided with a sensor S1 disposed for detecting the forward end of the substrate in the vicinity of the substrate conveying passage in front of the tacking position. When the forward end of the insulating substrate 11 in the direction of conveyance is detected by the sensor S1, the sensor S1 gnerates a detection signal to start the operation of a preset counter of a CPU 24, which will be described below. When a predetermined time has passed, the preset counter generates a control signal to stop the forward end of the insulating substrate 11 in the tacking position. For example, the sensor S1 may be constituted by a photoelectric switch.

Further, the front-stage conveyer 17 is provided with a sensor S2 disposed in the vicinity of the substrate conveying passage in front of the sensor S1 in a position for detecting the backward end of the substrate. When the backward end of the insulating substrate 11 in the direction of conveyance is detected by the sensor S2, the sensor S2 generates a detection signal to start the operation of a preset counter of the CPU 24 in the same manner as described above concerning the sensor S1. When a predetermined time has passed, the preset counter generates a control signal to form the slack 1B' of the stratified part 1B in the backward end in the feeding direction, cut the stratified part 1B at the designated cutting position with the cutting device 14, and laminate the rearward end of the thus-cut stratified part 1B onto the insulating substrate 11 by thermocompression-bonding. At the same time, the preset counter generates a control signal to move the thermocompression-bonding rollers 16 from the tacking position 16(2) to the vicinity 16(4) of the standby position, as will be described below in more detail. For example, the sensor S2 may be constituted by a photoelectric switch, similarly to the sensor S1.

The rear-stage conveyer 18 is constituted by lower conveyer rollers 18A and upper conveyer rollers 18B. The rear-stage conveyer 18 conveys the insulating substrate 11 to the exposure position where a wiring pattern is formed after the stratified part 1B has been thermocompression-bonding-laminated onto the insulating substrate 11 by the thermocompression-bonding rollers 16 in the thin-film coating apparatus.

Figure 7:
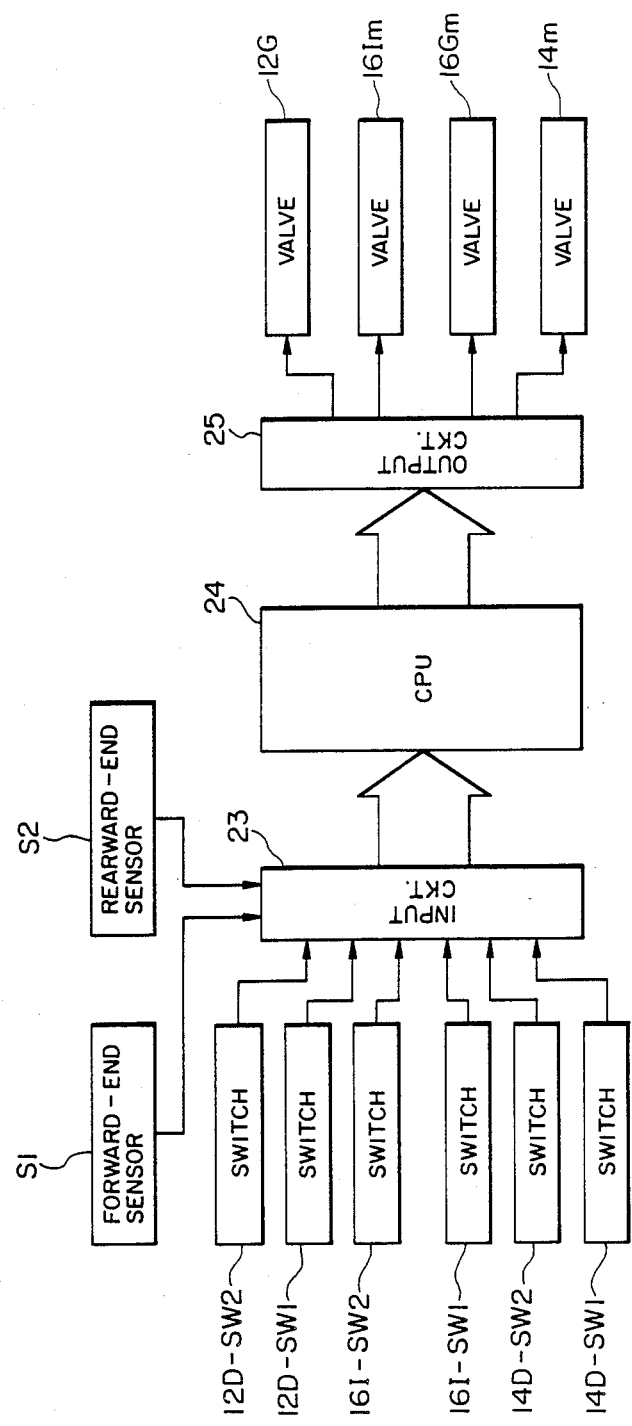
FIG. 7 is a block diagram showing a control system for the thin film coating apparatus.

The detection signals from the sensors S1 and S2 for detecting the forward end and backward end, respectively, of the insulating substrate in the direction of conveyance are fed to the CPU (microcomputer) 24 via an input circuit 23, as shown in FIG. 7, which is a block diagram showing a control system. The CPU 24 includes presettable counters, arithmetical circuits, discriminating circuits, memories, and the like.

Similarly, when each of the switches 12D-SW1, 12D-SW2, 16I-SW1, 16I-SW2, 14D-SW1 and 14D-SW2 in the driving source 12D X-direction driving source 16I, and cutting device 14 operates, a corresponding signal is fed to the CPU 24 via the input circuit 23.

The CPU 24 executes predetermined processing on the basis of the respective signals. As a result of this processing, the CPU 24 generates a control signal via an output circuit 25 to control the respective electromagnetic valve 12G (namely, the electromagnetic solenoid 12Gi) and the like. As described above, the electromagnetic valve 12G controls the shaft 12Da of the driving source 12D as shown in FIG. 3. Similarly, another electromagnetic valve 16Im (not illustrated in detail controls the shaft of the X-direction driving source 16I. A further electromagnetic valve 16Gm controls the shaft of the Y-direction driving source 16G. A still further electromagnetic valve 14M controls the movable member 14E which moves within the hollow tube 14D.

As shown in FIGS. 1 and 2, thin film correctors 19 are provided on the apparatus body 7 (or on the front-stage conveyer 17 or on the supporting member 12) in the vicinity of the thin film feeding passage of the tack portions 10E of the main vacuum plates 10. Each thin film corrector 19 corrects the forward end of the stratified part 1B in the direction of the arrow G to move it closer to the tack portion 10E. The thin film corrector 19 is constituted by a fluid carrying pipe 19A extending in the direction of width of the stratified part 1B, and a plurality of fluid spraying holes 19B provided in the fluid carrying pipe 19A.

The fluid carrying pipe 19A, which is hollow in its interior, passes a fluid with a pressure higher than atmospheric pressure. Although this embodiment has been described with respect to the case where the fluid carrying pipe 19A is approximately circular in cross section, it is understood that the invention is not limited thereto and that the pipe 19A may be rectangular or elliptical.

The fluid spraying holes 19B are used to spray a fluid in a direction to correct the stratified part 1B.

Air is preferably used as a fluid used in the thin film corrector 19. Alternatively, the fluid used in the thin film corrector 19 may be a gas, such as an inert gas and the like, or a liquid, such as water, oil and the like.

Further, as shown in FIGS. 1 and 2, thin film projectors 20 are provided on the apparatus body 7 (or on the front-stage conveyer 17 or on the supporting member 12) in the vicinity of the stratified part 1B (1B') fed between the lower suction portion 13b of the sub-vacuum plate 13 and the rotary vacuum plate 1. Each of the thin film projectors 20 forms the slackened stratified part 1B' in a direction closer to the thermocompression-bonding roller 16 (in the direction of the arrow H). The thin film projector 20 is constituted by a fluid carrying pipe 20A extending in the direction of width of the stratified part 1B, and a plurality of fluid spraying holes 20B formed in the fluid carrying pipe 20A.

The fluid carrying pipe 20A is made hollow so as to pass a fluid with a pressure higher than atmospheric pressure. Although this embodiment has been described with respect to the case where the fluid carrying pipe 20A is substantially circular in cross section, it is to be understood that the invention is not limited thereto and that the pipe 20A may be rectangular or elliptical in cross section, similarly to the foregoing fluid carrying pipe 19A.

The fluid spraying holes 20B are employed to spray a fluid in a direction to project the slack of the stratified part 1B' as described above.

Air is preferably used as the fluid in the thin film projector 20 in the same manner as described above regarding the thin film corrector 19. Alternatively, the fluid used in the thin film projector 20 may be a gas, such as in inert gas and the like, or a liquid, such as water, oil and the like.

According to the present invention, the thin film corrector 19 or the thin film projector 20 may be constituted by a plurality of fluid spraying nozzles arranged in the direction of width of the stratified part 1B to correct or project the stratified part 1B in the proper direction as described above.

The thin film corrector 19 or the thin film projector 20 may be constituted by a suction pipe extending in the direction of width of the stratified part 1B, and a plurality of suction holes formed in the suction pipe to apply suction to the stratified part 1B to correct or project it in the proper direction, as described above.

Further according to the present invention, the thin film corrector 19 or the thin film projector 20 may be constituted by a convex member arranged to correct or project the stratified part 1B in the proper direction as described above.

Moreover, the thin film corrector 19 may be made to serve also as the thin film projector 20, or the thin film projector 20 may be made to serve as the thin film corrector 19.

As shown in FIGS. 1 and 2, a substrate guiding member 21 is provided on the apparatus body 7 (or on the rear-stage conveyer 18) between the thermocompression-bonding roller 16 placed in the tacking position 16(2) and the conveyer roller 18A of the rear-stage conveyer 18. The substrate guiding member 21 guides the insulating substrate 11 having the stratified part 1B thermocompression-bonding-laminated thereto from the thermocompression-bonding-laminating position (tacking position) to the position of the conveyer rollers 18A and 18B. For example, the substrate guiding member 21 may have a plurality of bar-like portions, each extending in the conveyance direction of the insulating substrate 11. The bar-like portions are arranged in the form of a comb in the direction of conveyance of the width of the substrate 11. The comb-shaped substrate guiding member 21 has a sufficiently small contact area with the insulating substrate 11 that frictional resistance can be reduced during the conveyance of the insulating substrate 11. Accordingly, the substrate guiding member 21 can guide the insulating substrate 11 smoothly.

According to the present invention, the substrate guiding member 21 may be shaped like a net or a plate.

A method of thermocompression-bonding-laminating the stratified part 1B employing the aforedescribed thin film coating apparatus will now be described with reference to FIGS. 1 through 7 and FIGS. 8 through 16 the latter being partly enlarged views showing various work steps.

At first, as shown in FIGS. 1 and 2, the feeding-direction forward end of the stratified part 1B separated by the thin film separating roller 3 is manually brought between the sub-vacuum plate 13 and the cutting device 14.

Next, the forward end of the stratified part 1B is held by suction by the sub-vacuum plate 13. After holding the stratified part 1B, the sub-vacuum plate 13 is moved away from the feeding passage of the stratified part 1B by the driving source 13A so that the forward end of the stratified part 1B is held by suction by the tack portion 10E. At this time, not only is suction applied by the main vacuum plate 10 and the tack portion 10E, but also the stratified part 1B is corrected by the thin film corrector 19. Accordingly, the forward end of the stratified part 1B is securely held by the tack portion 10E. While the continuous operation is being carried out, the forward end of the stratified part 1B cut by the cutting device 14 is suction-held by the tack portion 10E.

Next, the insulating substrate 11 is conveyed by the conveyer rollers 17A and 17B of the front-stage conveyer 17.

Figure 8:
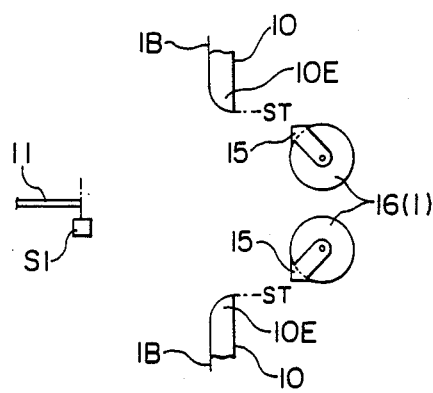

Subsequently, as shown in FIG. 8, when the conveyance-direction forward end of the insulating substrate 11 passes through the position where the forward end of the substrate 11 is detected, the sensor S1 is operated. The detection signal of the sensor S1 is fed to the CPU 24 via the input circuit 23 shown in FIG. 7 to thereby actuate a preset counter. This counter counts a predetermined time, after which the conveyance-direction forward end of the insulating substrate 11 is stopped at the tacking position.

Further, the detection signal of the sensor S1 actuates another preset counter of the CPU 24. The other preset counter counts a time to start moving the tack portion 10E close to the conveyance passage while the conveyance-direction forward end of the insulating substrate 11 is being conveyed from the substrate-forward-end detection position to the tacking position.

In the condition shown in FIG. 8, the tack portion 10E (the main vacuum plate 10) is located in the tacking operation start position ST1, whereas the thermocompression-bonding roller 16 is located in the standby position 16(1). The tacking operation start position ST1 is a position where the switch 12D-SW2 of the driving source 12D for moving the main vacuum plate 10 is operated and the upper and lower supporting members 12 are stopped at the nearest position to the conveyance passage of the substrate.

Figure 9:
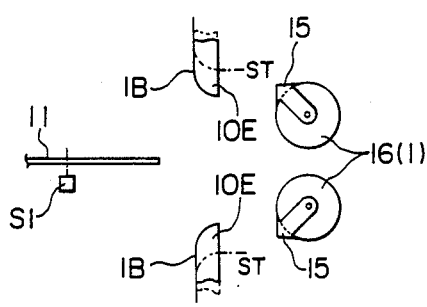

Next, as shown in FIG. 9, while the conveyance-direction forward end of the insulating substrate 11 is being conveyed from the substrate-forward-end detection position to the tacking position, the movement of the tack portion 10E close to the conveyance passage is started. More particularly, the motion of the tack portion 10E is started by controlling the electromagnetic valve 12G by the CPU 24 through the output circuit 25 on the basis of the output signal of the other preset counter to thereby control the driving source 12D.

Figure 10:
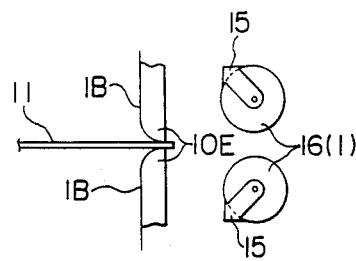

Next, when the conveyance-direction forward end of the insulating substrate 11 reaches the tacking position, the conveyance of the insulating substrate 11 is stopped in response to the output signal from the first preset counter. Upon or soon after the stopping of the insulating substrate 11, the tack portion 10E moves close to the conveyance passage so as to come into contact with the conveyance-direction forward end of the conductive layer of the insulating substrate 11, whereby the forward end of the stratified part 1B held by the tack portion 10E is temporarily thermocompression-bonded as shown in FIG. 10.

In the aforedescribed method of adhering the stratified part 1B, a detection signal is generated upon the detection of the conveyance-direction forward end of the substrate at a designated detection position before being conveyed to the tacking position to thereby stop the conveyance-direction forward end of the substrate after it has been conveyed from the detection position to the tacking position, and the tack members are moved close to the conveyance passage of the substrate while the conveyance-direction forward end of the substrate is being conveyed from the detection position to the tacking position to thereby tack the feeding-direction forward end of the thin film onto the surface of the substrate with the tack members after the conveyance-direction forward end of the substrate has stopped at the tacking position. Accordingly, the time required for moving the tack members 10E close to the conveyance passage can be partly included in the time required for conveying the conveyance-direction forward end of the substrate 11 from the substrate-forward-end detection position to the tacking position, and thus the time required for moving the tack members 10E close to the conveyance passage (the time from the stop of the conveyance-direction forward end of the insulating substrate 11 to the termination of the tacking operation) can be shortened to thereby shorten the time required for adhering the stratified part 1B.

Consequently, the per unit processing time can be reduced to thereby improve the productivity of the film coating process.

When the tack portion 10E touches the conveyance-direction forward end of the conductive layer of the insulating substrate 11, the switch 12D-SW1 of the driving source 12D is actuated. The output signal of the switch 12D-SW1 is fed to the CPU 24. After continuing the tacking operation for a predetermined time, the CPU 24 stops the suction operation of the main vacuum plate 10 and the tack portion 10E to thereby move the main vacuum plate 10 and the tack portion 10E away from the conveyance passage by the driving sources 12C and 12D. More particularly, the main vacuum plate 10, the tack portion 10E and the sub-vacuum plate 13 are moved to a relatively far-removed positions compared with the position shown in FIGS. 1 and 2. The distance moved is proportional to the amount of slack in the stratified part 1B'.

Figure 11:
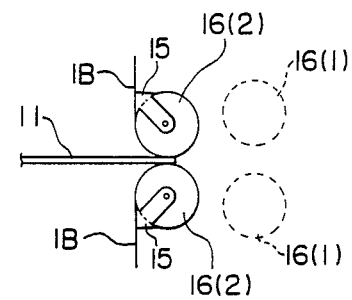

Next, as shown in FIG. 11, the thermocompression-bonding roller 16 is moved from the standby position 16(1) (dotted line) to the tacking position 16(2) (solid line) so as to come into contact with the stratified part 1B to which the feeding-direction forward end has been tacked.

Figure 12:
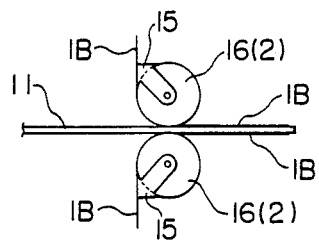

Then, as shown in FIG. 12, the stratified part 1B is thermocompression-bonding-laminated onto the conductive layer of the insulating substrate 11 by rotating the thermocompression-bonding rollers 16 with the insulating substrate 11 sandwiched between the thermocompression-bonding rollers 16. At this time, the suction operation by the main vacuum plate 10, the tack portion 10E and the sub-vacuum plate 13 is stopped. Accordingly, the stratified part 1B is automatically fed from the feed rollers 2 to the thermocompression-bonding rollers 16 by the rotational force thereof and the force supporting the insulating substrate 11.

After a predetermined quantity of stratified part 1B is thermocompression-bonding-laminated, the conveyance-direction rearward end of the insulating substrate 11 is detected by the sensor S2 at the substrate-rearward-end detection position as shown in FIG. 1. The detection signal of the sensor S2 is fed to the CPU 24, which in response starts simultaneously the respective suction operations of the main vacuum plate 10, the sub-vacuum plate 13 and the rotary vacuum plate 15 (not shown in FIG. 7). The supporting member 12 is moved from the farthest position from the substrate conveyance passage by the driving source 12C and the stratified part 1B is fed toward the insulating substrate 11. At the same time, as shown in FIG. 2, the lower suction portion 13B of the sub-vacuum plate 13 is operated so that the feeding-direction rearward end (cutting position) of the stratified part 1B coincides with the cutting position of the cutting device 14. The feeding speed of the stratified part 1B (the speed of the supporting member 12) is established to be more than the thermocompression-bonding-laminating speed of the thermocompression-bonding roller 16, that is, the peripheral speed of the thermocompression-bonding roller 16.

In this condition, the stratified part 1B is slackened between the sub-vacuum plate 10 and the rotary vacuum plate 15 to form a slackened stratified part 1B'. The feeding-direction opposite ends of the slackened stratified part 1B' can be securely held respectively by the lower suction portion 13b of the sub-vacuum plate 13 and the rotary vacuum plate 15 through correction by the thin film corrector 20.

Figure 13:
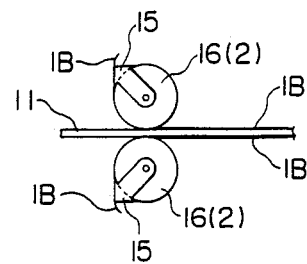

Next, as shown in FIG. 13, the feeding-direction rearward end of the stratified part 1B which coincides with the cutting position of the cutting device 14 is cut into a predetermined length corresponding to the size of the insulating substrate 11 by the cutting device 14. As described above, the cutting device 14 can cut the stratified part 1 by moving the disc-like cutter 14C in the direction crossing the feeding direction of the stratified part 1.

When the feeding-direction rearward end of the stratified part 1B is cut by the cutting device 14, one of the switches 14D-SW1 and 14D-SW2 is operated by the member 14E which moves within the hollow tube 14D. The output signal of the switch 14D-SW1 or 14D-SW2 is fed to the CPU 24, whereupon the electromagnetic valve 16I$m$ is controlled by the CPU 24 to thereby control the X-direction driving source 16I. As shown in FIG. 16, the X-direction driving source 16I moves the thermocompression-bonding roller 16 in the direction of the arrow X, that is, in the substrate conveyance direction (FIG. 14 shows the condition in which the thermocompression-bonding roller has been moved to the position 16(3)) while the feeding-direction rearward end of the stratified part 1B is being laminated by thermocompression-bonding.

Next, as shown in FIG. 15, the feeding-direction rearward end of the stratified part 1B is moved onto the conductive layer of the insulating substrate 11 by the rotary vacuum plate 15 until the stratified part 1B is thermocompression-bonding-laminated to the substrate 11, while the thermocompression-bonding roller 16 is being moved to convey the insulating substrate 11. The thermocompression-bonding roller 16 can be moved close to the standby position 16(1) (more particularly, to the position 16(4) as shown in FIG. 15) nearest to the standby position in the X-direction. The rotational speed of the rotary vcuum plate 15 is slightly lower than the rotational speed of the thermocompression-bonding roller 16 so that the rearward end of the stratified part 1B can be thermocompression-bonding-laminated onto the conductive layer of the insulating substrate 11. That is, when the rotary vacuum plate 15 rotates at a speed slightly lower than that of the thermocompression-bonding roller 16, a proper amount of tension can be applied to the stratified part 1B between the rotary vacuum plate 15 and the thermocompression-bonding roller 16. Accordingly, the stratified part 1B can be securely thermocompression-bonding-laminated without crumpling.

Next, after the thermocompression-bonding lamination is finished, the thermocompression-bonding roller 16 is moved from the vicinity 16(4) of the standby position to the standby position 16(1) in the direction of the arrow Y so as to be out of the substrate conveyance passage, as shown in FIG. 16. When the switch 16I-SW2 of the X-direction driving source 16I is actuated, the CPU 24 controls the electromagnetic valve 16G$m$ after the passage of a predetermined time so that the valve 16G$m$ controls the Y-direction driving source 16G to cause the thermocompression-bonding roller 16 to move in the direction of the arrow Y.

FIG. 21 is a timing chart of the operation of the thermocompression-bonding roller 16 according to the invention in comparison with the conventional thermocompression-bonding roller. As shown in FIG. 21, in the prior art, the thermocompression-bonding roller is moved in the Y-direction after thermocompression-bonding lamination, and then it is moved in the X-direction. According to the present invention, however, the thermocompression-bonding roller 16 is moved to the vicinity 16(4) of the standby position in the X-direction during thermocompression-bonding lamination, and then it is moved to the standby position 16(1) in the Y-direction.

In the aforediscussed method of adhering the stratified part 1B, the thermocompression-bonding rollers 16 are moved from the tacking position 16(2) to the vicinity 16(4) of the standby position while the tacked stratified part 1B is being thermocompression-bonding-laminated onto the conductive layer of the insulating substrate 11. Accordingly, the time required for moving the thermocompression-bonding rollers 16 from the tacking position 16(2) to the standby position 16(1) can be partly included in the time required for adhering the stratified part 1B onto the insulating substrate 11 so that the time of movement of the thermocompression-bonding rollers 16 after the stratified part 1B is adhered to the substrate can be shortened to thereby shorten the total time required for applying the stratified part 1B.

Furthermore, according to the present invention, not only is the time required for moving the tack members 10E close to the conveyance passage shortened, but also the time taken for movement of the thermocompression-bonding rollers 16 shortened to thereby shorten the total time required for applying the stratified part 1B more remarkably.

Consequently, the production rate attained with the invention is significantly improved.

The insulating substrate 11 having the stratified part 1B thermocompression-bonding-laminated thereon can be smoothly conveyed by the conveyer rollers 18A and 18B of the rear-stage conveyer 18 through the substrate guiding member 21. The insulating substrate 11 is conveyed to the exposure device by the rear-stage conveyer 18.

The invention is applicable to the case where such thermocompression-bonding lamination is continuously carried out, as illustrated in FIGS. 17 through 20 (partly enlarged views showing various work steps).

Similarly to the step 12 of the foregoing thermocompression-bonding-laminating method, the stratified part 1B tacked at the feeding-direction forward end is thermocompression-bonding-laminated at the tacking position 16(1) by the thermocompression-bonding roller 16, as shown in FIG. 17.

Next, the conveyance-direction rearward end of the insulating substrate 11 is detected by the sensor S2 (not shown in detail), and then the stratified part 1B is cut by the cutting device 14. As described above, after cutting, the operation of moving the thermocompression-bonding roller 16 from the tacking position 16(2) to the vicinity 16(4) of the standby position is started while the stratified part 1B is being thermocompression-bonding-laminated. As shown in FIG. 18, during this operation, the feeding-direction forward end of the stratified part 1B is suction-held by the tack portion 10E in preparation for the succeeding step. The insulating substrate 11' is successively conveyed so as to be thermocompression-bonding-laminated in the succeeding step.

Subsequently, as shown in FIG. 19, when the conveyance-direction forward end of the insulating substrate 11' to be laminated in the succeeding step is detected by the sensor S1, the operation of moving the tack portion 10E close to the conveyance passage starts. At this time, the insulating substrate 11, which is subjected to thermocompression-bonding lamination in the preceding step, is conveyed while the feeding-direction rearward end thereof is being thermocompression-bonding-laminated. At the same time, the thermocompression-bonding roller 16 is moved from the tacking position 16(2) toward the vicintiy 16(4) of the standby position and located in the position 16(3). Thus, the thermocompression-bonding roller 16 never touches the tack portion 10E.

As shown in FIG. 20, when the thermocompression-bonding roller 16 is moved to the vicinity 16(4) of the standby position and thermocompression-bonding lamination is terminated (just after or before termination), the tacking operation in the succeeding step is completed. Accordingly, the thermocompression-bonding lamination (tacking operation) in the succeeding step can be carried out during the thermocompression-bonding lamination in the preceding step.

In the aforedescribed method of sticking the stratified part 1B, the thermocompression-bonding lamination in the succeeding step is carried out while the thermocompression-bonding lamination in the preceding step is being performed. Accordingly, the time required for thermocompression-bonding lamination in the succeeding step can be partly included in the time required for thermocompression-bonding lamination in the preceding step to thereby shorten the time required until the start of thermocompression-bonding lamination in the succeeding step, and thus the total time required for applying the stratified part 1B can be shortened.

While the present invention has been described with reference to preferred embodiments thereof, it is a matter of course that the present invention is not limited to these embodiments and that various changes and modifications may be made without departing from the spirit of the invention.

As one modification, the cutting device 14 may be arranged to move in the same direction as the feeding direction of the stratified part 1B so that the stratified part 1B can be cut while the cutting device 14 is being moved.

As another modification, the sub-vacuum plate 13 may be separated into two parts, that is, one serving for suction-holding the feeding-direction forward end of the stratified part 1B to the tacking portion 10E and the other serving as a holder of the cutting device 14. Thus, the two parts may be controlled independently.

Further, the invention is applicable to a thin film coating apparatus in which the stratified part 1B is thermocompression-bonding-laminated onto the insulating substrate 11 by other, non-thermal compression-bonding rollers after the insulating substrate 11 is preliminarily heated.

In addition, the present invention is applicable to a thin film coating apparatus in which a protective film is stuck onto a decorative board used as a building material.

According to one aspect of the present invention, in a method of coating a substrate with a thin film including steps of bringing tack members close to a surface of the substrate at its forward end in the conveyance direction to thereby temporarily tack a forward end portion of the thin film in the feeding direction onto the forward end surface of the substrate , moving compression-bonding rollers into a tacking position where the forward end portion of the thin film is tacked from a standby position where the compression-bonding rollers do not touch the respective tack members to thereby make compression-bonding contact with the forward end portion of the tacked thin film after the tack members are moved away from the surface of the substrate, and rotating the compression-bonding rollers at the taking position for the double purpose of conveying the substrate and adhering the thin film to the substrate, the inventive thin film coating method is characterized in that the forward end of the substrate is detected to produce a detection signal at a detection position before the substrate is conveyed to the tacking position, the conveyance of the substrate is stopped after the forward end of the substrate has been conveyed from the detection position to the tacking position, and the tack members are brought close to a conveyance passage of the substrate while the forward end of the substrate is being conveyed from the detection position to the tacking position to thereby tack the forward end of the thin film to the surface of the substrate after the forward end of the substrate has been stopped at the taking position. Accordingly, the time required for moving the tack members close to the conveyance passage can be partly included in the time required for conveying the conveyance-direction forward end of the substrate from the detection position to the tacking position, and hence the time required for moving the tack members close to the conveyance passage after the stopping of the substrate can be shortened to thereby shorten the total time required for applying the thin film.

According to another aspect of the present invention, the above-described thin film coating method is characterized in that the compression-bonding rollers are moved near to the standby position from the tacking position while the tacked thin film is being adhered to the surface of the substrate. Accordingly, the time required for moving the compression rollers from the tacking position to the standby position can be partly included in the time required for adhering the thin film onto the surface of the substrate, and hence the time of movement of the compression-bonding rollers after the thin film is adhered to the surface of the substrate can be shortened to thereby shorten the total time required for applying the thin film.

According to a further aspect of the present invention, the described thin film coating method is characterized in that the forward end of the substrate is detected to produce a detection signal at a detection position before the substrate is conveyed to the tacking position, the conveyance of the substrate is stopped after the forward end of the substrate has been conveyed from the detection position to the tacking position, the tack members are brought close to a conveyance passage of the substrate while the forward end of the substrate is being conveyed from the detection position to the tacking position to thereby tack the forward end of the thin film to the surface of the substrate after the forward end of the substrate is stopped at the tacking position, and the compression-bonding rollers are moved near to the standby position from the tacking position while the tacked thin film is being adhered to the surface of the substrate. Accordingly, not only the time is required for moving the tack members close to the conveyance passage shortened, but also the time of movement of the compression-bonding rollers after the thin film is adhered to the surface of the substrate can be shortened to thereby shorten the total time required for applying the thin film more remarkably.

What is claimed is:

1. In a method of coating a substrate with a thin film comprising steps of moving tack members close to a surface of said substrate at its forward end in a conveyance direction thereof to thereby temporarily tack a forward end portion of said thin film in a feeding direction thereof to said forward end surface of said substrate, moving compression-bonding rollers into a tacking position where said forward end portion of said thin film is tacked from a standby position where said compression-bonding rollers do not touch respective ones of said tack members to thereby make said compression-bonding rollers contact said forward end portion of said tacked thin film after said tack members are moved away from the surface of said substrate, and rotating said compression-bonding rollers at said tacking position for the dual purpose of conveying said substrate and adhering said thin film to said substrate, the improvement comprising the steps of: moving said compression-bonding rollers near said standby position from said tacking position simultaneously while said tacked thin film is being adhered onto said surface of said substrate.

2. The thin film coating method according to claim 1, wherein said thin film is prepared by cutting a continuous thin film correspondingly to a size of said substrate in the conveyance direction thereof.

3. The thin film coating method according to claim 2, wherein, after said continuous thin film is cut by said cutting device, said compression-bonding rollers are moved near said standby position from said tacking position simultaneously while said tacked thin film is being adhered to said surface of said substrate.

4. The thin film coating method according to any one of claims 1 through 3, wherein said compression-bonding rollers are moved near said standby position from said tacking position in the same direction as said conveyance direction of said substrate while said tacked thin film is being stuck to said surface of said substrate.

5. In a method of coating a substrate with a thin film comprising steps of moving tack members close to a surface of said substrate at its forward end in a conveyance direction thereof to thereby temporarily tack a forward end portion of said thin film in a feeding direction thereof to said forward end surface of said substrate, moving compression-bonding rollers into a tacking position where said forward end portion of said thin film is tacked from a standby position where said compression-bonding rollers do not touch respective ones of said tack members to thereby make said compression-bonding rollers contact said forward end portion of said tacked thin film after said tack members are moved away from the surface of said substrate, and rotating said compression-bonding rollers at said tacking position for the dual purpose of conveying said substrate and adhering said thin film to said substrate, the improvement comprising the steps of: detecting said forward end of said substrate to produce a detection signal at a detection position before said substrate is conveyed to said tacking position, stopping conveyance of said substrate after said forward end of said substrate has been conveyed from said detection position to said tacking position, bringing said tack members close to a conveyance passage of said substrate while said forward end of said substrate is being conveyed from said detection position to said tacking position to thereby tack said forward end of said thin film to said surface of said substrate after said forward end of said substrate is stopped at said tacking position, and moving said compression-bonding rollers near said standby positon from said tacking position while said tacked thin film is being adhered to said surface of said substrate.

* * * * *